(12) United States Patent
Wang et al.

(10) Patent No.: US 9,425,330 B2
(45) Date of Patent: Aug. 23, 2016

(54) METAL OXIDE METAL CAPACITOR WITH SLOT VIAS

(71) Applicants: Chin-Shan Wang, Hsinchu (TW); Jian-Hong Lin, Yunlin (TW); Chien-Jung Wang, Hsinchu (TW)

(72) Inventors: Chin-Shan Wang, Hsinchu (TW); Jian-Hong Lin, Yunlin (TW); Chien-Jung Wang, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 400 days.

(21) Appl. No.: 13/745,238

(22) Filed: Jan. 18, 2013

(65) Prior Publication Data

US 2013/0127016 A1 May 23, 2013

Related U.S. Application Data

(63) Continuation of application No. 12/768,001, filed on Apr. 27, 2010, now Pat. No. 8,379,365.

(60) Provisional application No. 61/173,439, filed on Apr. 28, 2009.

(51) Int. Cl.
| | |
|---|---|
| H01G 4/005 | (2006.01) |
| H01G 4/06 | (2006.01) |
| H01L 29/92 | (2006.01) |
| H01G 4/012 | (2006.01) |
| H01G 4/228 | (2006.01) |
| H01G 4/30 | (2006.01) |
| H01G 4/33 | (2006.01) |
| H01L 23/522 | (2006.01) |
| H01L 49/02 | (2006.01) |

(52) U.S. Cl.
CPC ............. *H01L 29/92* (2013.01); *H01G 4/012* (2013.01); *H01G 4/228* (2013.01); *H01G 4/30* (2013.01); *H01G 4/33* (2013.01); *H01L 23/5222* (2013.01); *H01L 28/60* (2013.01); *H01L 28/86* (2013.01); *H01L 28/90* (2013.01); *H01L 2924/0002* (2013.01)

(58) Field of Classification Search
CPC ................................ H01G 4/30; H01G 4/005
USPC .................................. 361/303, 305, 311
See application file for complete search history.

(56) References Cited

U.S. PATENT DOCUMENTS

| | | | |
|---|---|---|---|
| 8,379,365 B2* | 2/2013 | Wang et al. ............ | 361/303 |
| 2002/0047154 A1* | 4/2002 | Sowlati et al. ............ | 257/307 |
| 2008/0079117 A1 | 4/2008 | Baumgartner et al. | |
| 2009/0097186 A1 | 4/2009 | Topaloglu | |

* cited by examiner

*Primary Examiner* — Eric Thomas
(74) *Attorney, Agent, or Firm* — Hauptman Ham, LLP

(57) ABSTRACT

A capacitor includes a first electrode including a plurality of first conductive lines, at least one first via, and at least one second via. The first conductive lines are parallel and connected to a first periphery conductive line. The first conductor lines in adjacent layers are coupled by the at least one first and second via. The at least one first via has a first length, and the at least one second via has a second length. The capacitor includes a second electrode opposite to the first electrode. The second electrode includes a plurality of second conductive lines and at least one third via. The second conductive lines are parallel and connected to a second periphery conductive line. The second conductor lines in adjacent layers are coupled by the at least one third via. The capacitor includes at least one oxide layer between the first electrode and the second electrode.

20 Claims, 3 Drawing Sheets

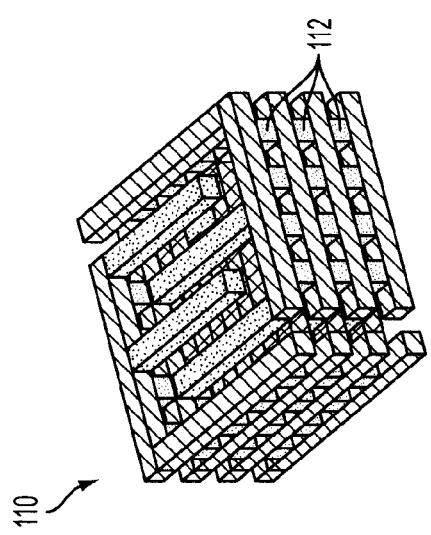
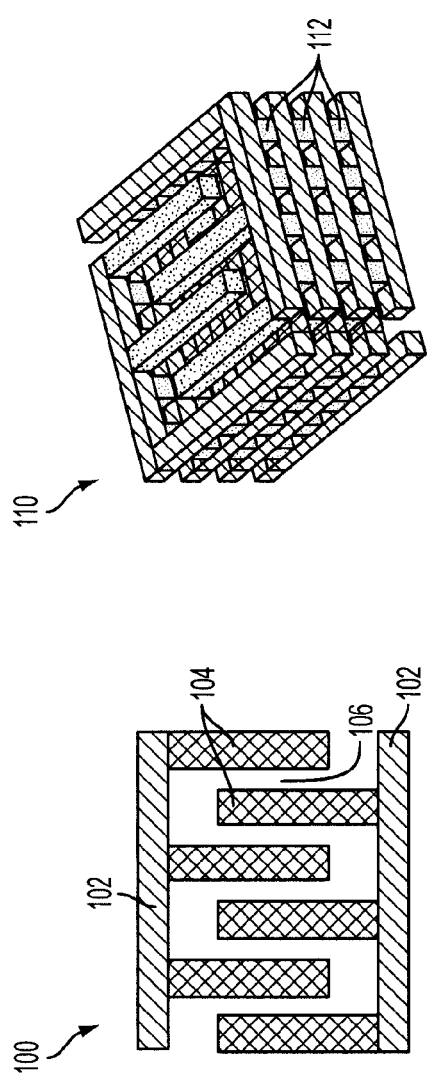
FIG. 1A
FIG. 1B
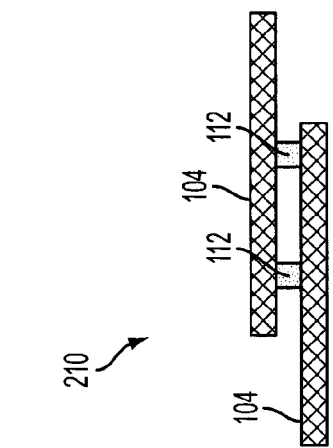
FIG. 2B
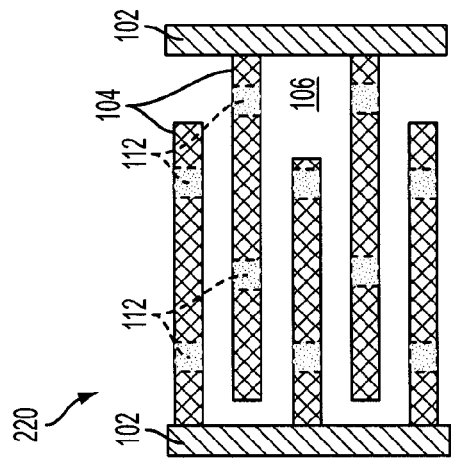
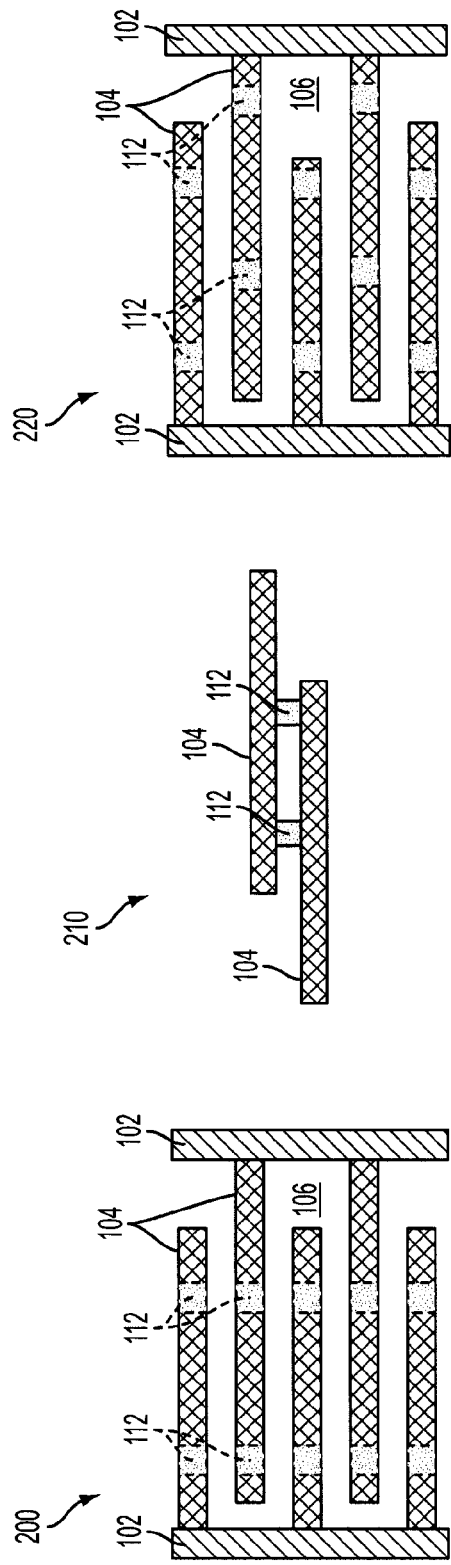
FIG. 2A
FIG. 2C

METAL OXIDE METAL CAPACITOR WITH SLOT VIAS

CROSS REFERENCE TO RELATED APPLICATIONS

This application is a continuation of U.S. application Ser. No. 12/768,001, filed on Apr. 27, 2010, which claims the priority of U.S. Prov. Appl. No. 61/173,439, filed Apr. 28, 2009, which are incorporated herein by reference in their entireties.

TECHNICAL FIELD

This disclosure relates generally to Metal Oxide Metal (MOM) capacitor, more specifically MOM capacitor with a slot (rectangular) via structure.

BACKGROUND

An exemplary single layer Metal-oxide-metal (MOM) capacitor structure is shown in FIG. 1A. The structure 100 has periphery metal 102, metal lines 104, and dielectric (oxide) layers 106. To increase the area usage efficiency, multiple layers of MOM capacitor structures could be vertically stacked together. FIG. 1B illustrates a stack (multi-layer) MOM capacitor structure, using vias 112 to connect each layer.

MOM capacitors have been used in the integrated circuits increasingly more often, partly because their minimal capacitive loss to the substrate results in high quality capacitors. Also, MOM capacitors with via have low cost and are easy to implement using a standard logic process. However, conventional MOM capacitors with via tend to have low capacitance and high resistance. Accordingly, important goals in manufacturing MOM capacitors are to increase the capacitance and reduce capacitor resistance, especially for Mixed Signal Radio Frequency (MSRF) product applications. Further, via resistance uniformity and reliable performance are important issues for MOM capacitors with high via density.

Accordingly, new structures and methods for MOM capacitors are desired to achieve higher capacitance and lower resistance, as well as performance reliability.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1A illustrates an exemplary single layer Metal-oxide-metal (MOM) capacitor structure;

FIG. 1B illustrates a stack (multi-layer) MOM capacitor structure, using vias to connect each layer;

FIG. 2A illustrates a top view of an example of a conventional multi-layer MOM capacitor structure with vias shown in dotted lines underneath the metal lines;

FIG. 2B illustrates a partial side view of a conventional multi-layer MOM capacitor structure with vias between two metal layers;

FIG. 2C illustrates a top view of an example of another conventional multi-layer MOM capacitor structure with vias shown in dotted lines underneath the metal lines;

DETAILED DESCRIPTION OF ILLUSTRATIVE EMBODIMENTS

Figure 3B:
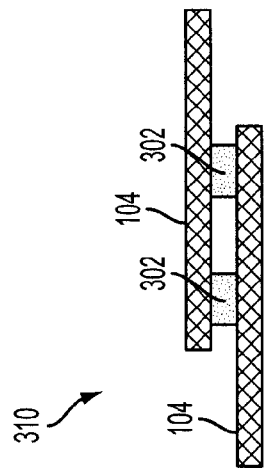
FIG. 3B illustrates a partial side view of an exemplary multi-layer MOM capacitor structure according to one aspect of this disclosure with vias between two metal layers.

The making and using of the presently preferred embodiments are discussed in detail below. It should be appreciated, however, that the present disclosure provides many applicable novel concepts that can be embodied in a wide variety of specific contexts. The specific embodiments discussed are merely illustrative and do not limit the scope of the disclosure.

A novel structure for Metal-oxide-metal (MOM) capacitor with slot (rectangular) vias is provided. The structure uses slot (rectangular) vias to lower resistance and increase capacitance due to extended via length and increased sidewall area. Throughout the various views and illustrative embodiments of the present disclosure, like reference numbers are used to designate like elements.

FIG. 2A illustrates a top view of an example of a conventional multi-layer MOM capacitor structure 200 with vias shown in dotted lines underneath the metal lines. The structure 200 has periphery metal 102, metal lines 104, and dielectric (oxide) layers 106. The vias 112 are square vias with a fixed size depending on the process (e.g. 0.05 μm×0.05 μm in a 32 nm process). The vias 112 are aligned with each other across multiple metal lines 104 from the top-view shown in FIG. 2A. The vias 112 connect each metal layer of the multi-layer MOM structure 200.

FIG. 2B illustrates a partial side view of a conventional multi-layer MOM capacitor structure with vias between two metal layers. The vias 112 connect metal lines 104 on different layers.

FIG. 2C illustrates a top view of an example of another conventional multi-layer MOM capacitor structure with vias shown in dotted lines underneath the metal lines. The structure 220 has periphery metal 102, metal lines 104, and dielectric (oxide) layers 106. The vias 112 are square vias with a fixed size depending on the process. The vias 112 are staggered across multiple metal lines 104 from the top-view shown in FIG. 2C. Even though the layout of the structure 220 is different from that of the structure 200, they both use fixed size square vias 112 to connect metal lines 104 between each layer.

Figure 3A:
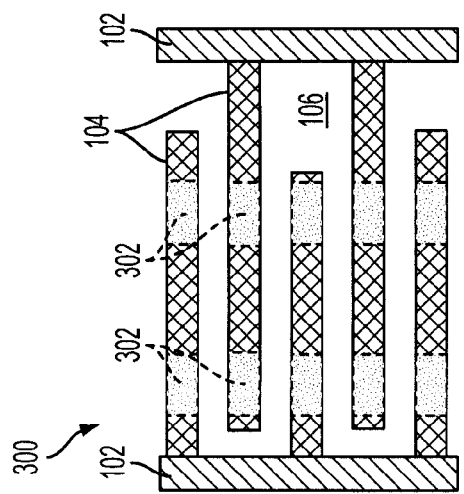
FIG. 3A illustrates a top view of an exemplary multi-layer MOM capacitor structure according to one aspect of this disclosure with vias shown in dotted lines underneath the metal lines.

FIG. 3A illustrates a top view of an exemplary multi-layer MOM capacitor structure according to one aspect of this disclosure with vias shown in dotted lines underneath the metal lines. The structure 300 has periphery metal 102, metal lines 104, and dielectric (oxide) layers 106. The periphery metal 102 and metal lines 104 could be copper, aluminum, tungsten, etc. The vias 302 are slot (rectangular) vias with a variable size depending on the process (e.g., 0.05 μm×0.13 μm in a 32 nm process). The vias 302 are aligned with each other across multiple metal lines 104 from the top-view shown in FIG. 3A. The vias 112 connect each metal layer of the multi-layer MOM structure 300. MOM capacitor with slot via structure can increase capacitance and reduce resistance by extended via length and increased via sidewall area.

In one embodiment of the structure 300 using the slot vias 302 with the size of 0.05 μm×0.13 μm, the capacitance increased about 1.6 times (10.34 pF), compared to one embodiment of the structure 200 using square vias 112 with the size of 0.05 μm×0.05 μm (6.477 pF). This capacitance increase is due to extended via length and increased sidewall area from using slot (rectangular) 302 instead of square vias 112.

FIG. 3B illustrates a partial side view of an exemplary multi-layer MOM capacitor structure according to one aspect of this disclosure with vias between two metal layers. The vias 302 connect metal lines 104 on different layers.

Figure 4A:
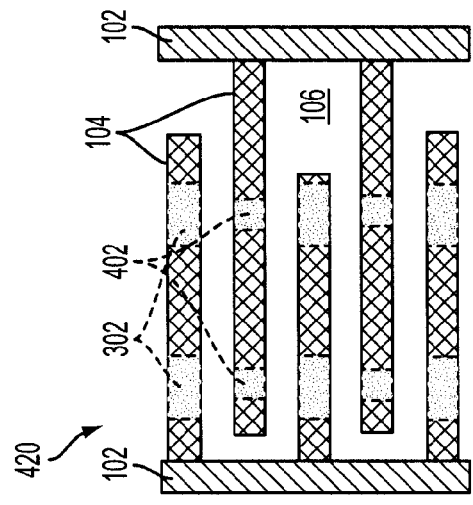
FIG. 4A-FIG. 4C illustrate a top view of other embodiments of a multi-layer MOM capacitor structure according to one aspect of this disclosure with vias shown in dotted lines underneath the metal lines.
Figure 4B:
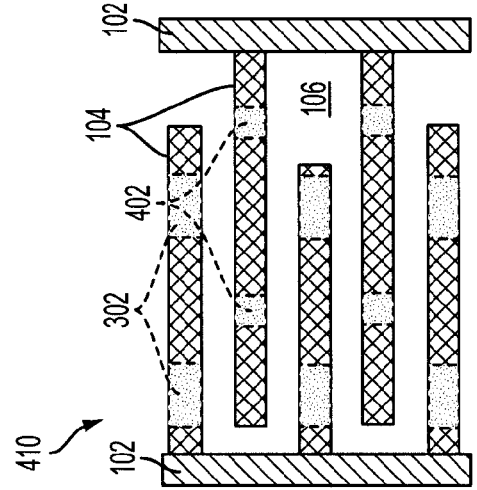
Figure 4C:
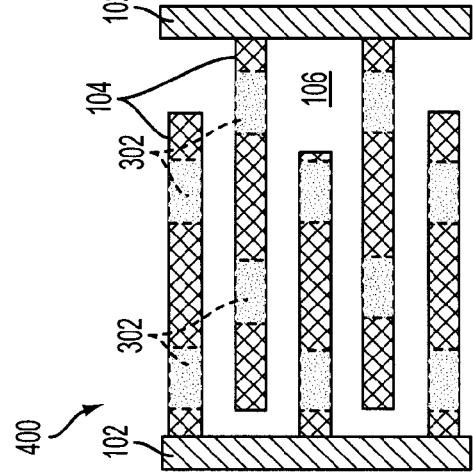

FIG. 4A-FIG. 4C illustrate a top view of other embodiments of a multi-layer MOM capacitor structure according to one aspect of this disclosure with vias shown in dotted lines underneath the metal lines. In FIG. 4A, the structure 400 has periphery metal 102, metal lines 104, and dielectric (oxide) layers 106. The vias 302 are slot (rectangular) vias with a variable size depending on the process (e.g., 0.05 μm×0.13 μm). The vias 302 are staggered across multiple metal lines 104 in the y-direction from the top-view shown in FIG. 4A. Even though the layout of the structure 400 is different from that of the structure 300, they both use slot vias 302 to connect metal lines 104 between each layer.

In FIG. 4B, the structure 410 has periphery metal 102, metal lines 104, and dielectric (oxide) layers 106. The vias 302 are slot (rectangular) vias with a variable size depending on the process (e.g., 0.05 μm×0.13 μm). The vias 402 are square vias with a variable size depending on the process (e.g. 0.05 μm×0.05 μm). In the structure 410, the vias 302 and 402 are used together (each on separate metal lines 104) and staggered across multiple metal lines 104 from the top-view shown in FIG. 4B. In another embodiment, the vias 302 and 402 can be mixed together in the same metal lines 104.

In FIG. 4C, the structure 420 has periphery metal 102, metal lines 104, and dielectric (oxide) layers 106. Like the structure 410, the vias 302 and 402 are used together (each on separate metal lines 104) in the structure 420, but the vias 302 and 402 are aligned with each other across multiple metal lines 104 from the top-view shown in FIG. 4C. In another embodiment, the vias 302 and 402 can be mixed together in the same metal lines 104.

Figure 5A:
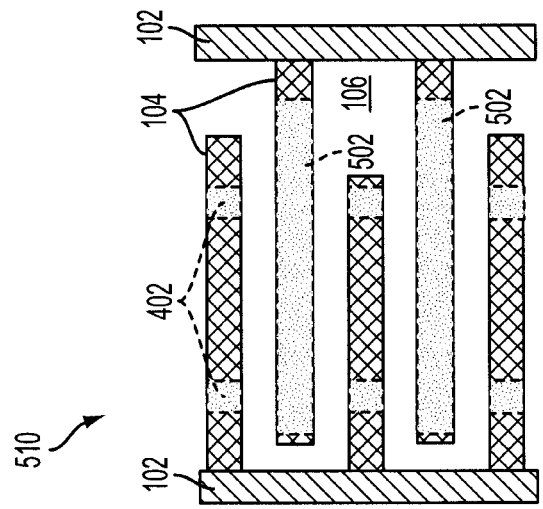
FIG. 5A-FIG. 5B illustrate a top view of different embodiments of a multi-layer MOM capacitor structure according to another aspect of this disclosure with vias shown in dotted lines underneath the metal lines.
Figure 5B:
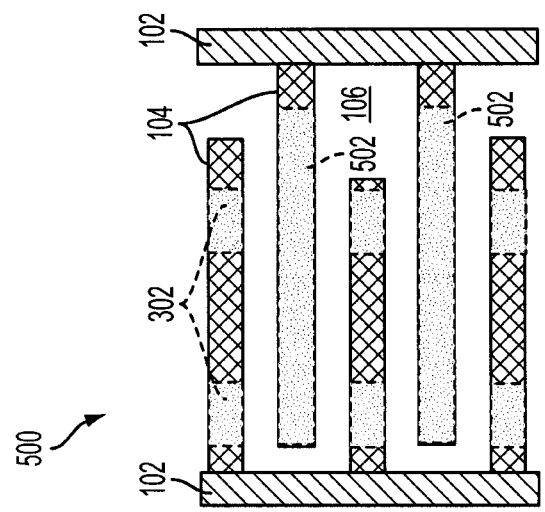

FIG. 5A-FIG. 5B illustrate a top view of different embodiments of a multi-layer MOM capacitor structure according to another aspect of this disclosure with vias shown in dotted lines underneath the metal lines. In FIG. 5A, the structure 500 has periphery metal 102, metal lines 104, and dielectric (oxide) layers 106. The vias 302 are slot (rectangular) vias with a variable size depending on the process (e.g., 0.05 μm×0.13 μm). The vias 502 are different size (elongated) rectangular vias. The vias 302 and 502 are alternating on different metal lines 104. The vias 302 are aligned with each other across multiple metal lines 104 from the top-view shown in FIG. 5A.

In FIG. 5B, the structure 510 has periphery metal 102, metal lines 104, and dielectric (oxide) layers 106. The vias 402 are square vias with a variable size depending on the process (e.g. 0.05 μm×0.05 μm). The vias 502 are elongated rectangular vias with a variable size depending on the process. The vias 402 and 502 are alternating on different metal lines 104. The vias 402 are aligned with each other across multiple metal lines 104 from the top-view shown in FIG. 5B.

The advantages of the new structures include increased capacitance and reduced resistance due to extended via lengths and increased via sidewall area. A skilled person in the art will appreciate that there can be many embodiment variations of this disclosure. For example, instead of slot (rectangular) vias, vias with other shapes (e.g. circular, oval, etc.) could be used, and many different size vias could be mixed and arranged in the structures for different embodiments.

One aspect of this description relates to a capacitor including a first electrode. The first electrode includes a plurality of first conductive lines, at least one first via, and at least one second via. The first conductive lines on the same layer are parallel to each other and connected to a first periphery conductive line. The first conductor lines aligned in adjacent layers are coupled to each other by the at least one first via and the at least one second via. The at least one first via has a first length parallel to the plurality of first conductive lines, and the at least one second via has a second length parallel to the plurality of first conductive lines different from the first length. The capacitor further includes a second electrode aligned opposite to the first electrode. The second electrode includes a plurality of second conductive lines and at least one third via. The second conductive lines on the same layer are parallel to each other and connected to a second periphery conductive line. The second conductor lines aligned in adjacent layers are coupled to each other by the at least one third via. The capacitor further includes at least one oxide layer formed between the first electrode and the second electrode.

Another aspect of this description relates to a capacitor including a first electrode. The first electrode includes a plurality of first conductive lines and at least one first via. The first conductive lines on the same layer are parallel to each other and connected to a first periphery conductive line. The first conductor lines aligned in adjacent layers are coupled to each other by the at least one first via. The capacitor further includes a second electrode aligned opposite to the first electrode. The second electrode includes a plurality of second conductive lines and a plurality of second vias. The second conductive lines on the same layer are parallel to each other and connected to a second periphery conductive line. The second conductor lines aligned in adjacent layers are coupled to each other by the plurality of second vias. The at least one first via overlaps with at least two of the plurality of second vias across the plurality of first conductive lines and the plurality of second conductive lines on a same layer. The capacitor further includes at least one oxide layer formed between the first electrode and the second electrode.

Still another aspect of this description relates to a capacitor including a first electrode. The first electrode includes a first periphery conductive line extending in a Y-direction and a plurality of first conductive lines connected to the first periphery conductive line, the each first conductive line of the plurality of first conductive lines extending in an X-direction perpendicular to the Y-direction. The first electrode further includes at least one first via extending in a Z-direction perpendicular to the X-direction and the Y-direction and at least one second via extending in the Z-direction. Aligned first conductor lines adjacent to each other in the Z-direction are coupled by the at least one first via and the at least one second via. The at least one first via has a first length in the X-direction, and the at least one second via has a second length in the X-direction different from the first length. The capacitor further includes a second electrode aligned opposite to the first electrode. The second electrode includes a second periphery conductive line extending in the Y-direction and a plurality of second conductive lines connected to the second periphery conductive line, wherein each second conductive line of the plurality of second conductive lines extends in the X-direction. The second electrode further includes at least one third via extending in the Z-direction. Aligned second conductor lines adjacent to each other in the Z-direction are coupled by the at least one third via. The capacitor further includes at least one oxide layer formed between the first electrode and the second electrode.

Although the present disclosure and its advantages have been described in detail, it should be understood that various changes, substitutions and alterations can be made herein without departing from the spirit and scope of the disclosure. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized.

What is claimed is:

1. A capacitor comprising:
    a first electrode comprising:
        a plurality of first conductive lines;
        at least one first via; and
        at least one second via, wherein the first conductive lines on the same layer are parallel to each other and connected to a first periphery conductive line, and the first conductive lines aligned in adjacent layers are coupled to each other by the at least one first via and the at least one second via, wherein the at least one first via has a first length parallel to the plurality of first conductive lines, and the at least one second via has a second length parallel to the plurality of first conductive lines different from the first length;
    a second electrode aligned opposite to the first electrode, the second electrode comprising:
        a plurality of second conductive lines; and
        at least one third via, wherein the second conductive lines on the same layer are parallel to each other and connected to a second periphery conductive line, the second conductive lines aligned in adjacent layers are coupled to each other by the at least one third via, and the at least one first via is staggered with respect to the at least one third via across the plurality of first conductive lines and the plurality of second conductive lines on a same layer; and
    at least one oxide layer formed between the first electrode and the second electrode.

2. The capacitor of claim 1, wherein the at least one third via has a third length parallel to the plurality of second conductive lines, and
    the second electrode further comprises at least one fourth via, the fourth via having a fourth length parallel to the plurality of second conductive lines different from the third length.

3. The capacitor of claim 1, wherein the at least one second via is aligned with the at least one third via across the plurality of first conductive lines and the plurality of second conductive lines on a same layer.

4. The capacitor of claim 1, wherein the at least one third via has a third length parallel to the plurality of second conductive lines, and the first length is equal to the third length.

5. The capacitor of claim 1, wherein the at least one third via has a third length parallel to the plurality of second conductive lines, and the first length is different from the third length.

6. The capacitor of claim 1, wherein one of the at least one first via or the at least one second via has a square shape.

7. The capacitor of claim 1, wherein the at least one first via, the at least one second via, and the at least one third via are square.

8. The capacitor of claim 1, wherein a shape of the at least one first via and a shape of the at least one second via are the same, and a shape of the at least one third via is different from the shape of the at least one first via.

9. A capacitor comprising:
    a first electrode comprising:
        a plurality of first conductive lines; and
        at least one first via, wherein the first conductive lines on the same layer are parallel to each other and connected to a first periphery conductive line, and the first conductive lines aligned in adjacent layers are coupled to each other by the at least one first via;
    a second electrode aligned opposite to the first electrode, the second electrode comprising:
        a plurality of second conductive lines; and
        a plurality of second vias, wherein the second conductive lines on the same layer are parallel to each other and connected to a second periphery conductive line, and the second conductive lines aligned in adjacent layers are coupled to each other by the plurality of second vias, wherein one of the at least one first via overlaps with at least two of the plurality of second vias directly connected to a same second conductive line of the plurality of second conductive lines across the plurality of first conductive lines and the plurality of second conductive lines on a same layer; and
    at least one oxide layer formed between the first electrode and the second electrode.

10. The capacitor of claim 9, wherein the plurality of second vias comprises:
    a third via having a length parallel to the plurality of second conductive lines; and
    a fourth via having a length parallel to the plurality of second conductive lines, wherein the length of the third via is different from the length of the fourth via.

11. The capacitor of claim 9, wherein each via of the plurality of second vias has a square shape.

12. The capacitor of claim 9, wherein each via of the plurality of second vias has a rectangular shape.

13. A capacitor comprising:
    a first electrode comprising:
        a first periphery conductive line extending in a Y-direction;
        a plurality of first conductive lines connected to the first periphery conductive line, the each first conductive line of the plurality of first conductive lines extending in an X-direction perpendicular to the Y-direction;
        at least one first via extending in a Z-direction perpendicular to the X-direction and the Y-direction; and
        at least one second via extending in the Z-direction, wherein aligned first conductive lines adjacent to each other in the Z-direction are coupled by the at least one first via and the at least one second via, wherein the at least one first via has a first length in the X-direction, and the at least one second via has a second length in the X-direction different from the first length;
    a second electrode aligned opposite to the first electrode, the second electrode comprising:
        a second periphery conductive line extending in the Y-direction;
        a plurality of second conductive lines connected to the second periphery conductive line, wherein each second conductive line of the plurality of second conductive lines extends in the X-direction; and at least one third via extending in the Z-direction, wherein aligned second conductive lines adjacent to each other in the Z-direction are coupled by the at least one third via, and the at least one first via is staggered with respect to the at least one third via in the Y-direction; and at least one oxide layer formed between the first electrode and the second electrode.

14. The capacitor of claim 13, wherein the at least one third via has a third length in the X-direction, and the second electrode further comprises at least one fourth via, the fourth via having a fourth length in the X-direction different from the third length.

15. The capacitor of claim 13, wherein the at least one second via is aligned with the at least one third via in the Y-direction.

16. The capacitor of claim 13, wherein the at least one third via has a third length in the X-direction, and the first length is equal to the third length.

17. The capacitor of claim 13, wherein the at least one third via has a third length in the X-direction, and the first length is different from the third length.

18. The capacitor of claim 13, wherein one of the at least one first via or the at least one second via has a square shape.

19. The capacitor of claim 13, wherein the second electrode further comprises at least one fourth via, the at least one first via is aligned with the at least one fourth via in the Y-direction, and the at least one second via is aligned with the at least one fourth via in the Y-direction.

20. The capacitor of claim 13, wherein the at least one first via, the at least one second via, and the at least one third via are square.

* * * * *